United States Patent
Li et al.

(10) Patent No.: US 10,249,731 B1
(45) Date of Patent: Apr. 2, 2019

(54) VERTICAL FET WITH SHARP JUNCTIONS

(71) Applicant: International Business Machines Corporation, Armonk, NY (US)

(72) Inventors: Juntao Li, Cohoes, NY (US); Kangguo Cheng, Schenectady, NY (US); Peng Xu, Guilderland, NY (US); Heng Wu, Guilderland, NY (US)

(73) Assignee: International Business Macines Corporation, Armonk, NY (US)

( * ) Notice: Subject to any disclaimer, the term of this patent is extended or adjusted under 35 U.S.C. 154(b) by 0 days.

(21) Appl. No.: 15/713,975

(22) Filed: Sep. 25, 2017

(51) Int. Cl.
| | |
|---|---|
| *H01L 29/66* | (2006.01) |
| *H01L 21/8238* | (2006.01) |
| *H01L 21/8234* | (2006.01) |
| *H01L 21/265* | (2006.01) |
| *H01L 29/786* | (2006.01) |

(52) U.S. Cl.
CPC ...... *H01L 29/66666* (2013.01); *H01L 21/265* (2013.01); *H01L 21/823412* (2013.01); *H01L 21/823418* (2013.01); *H01L 21/823885* (2013.01); *H01L 29/66553* (2013.01); *H01L 29/78696* (2013.01)

(58) Field of Classification Search
CPC ........... H01L 29/66666; H01L 29/6653; H01L 29/66795; H01L 21/823418; H01L 29/78696; H01L 21/265; H01L 21/823412; H01L 21/823885; H01L 29/66553
See application file for complete search history.

(56) References Cited

U.S. PATENT DOCUMENTS

| | | | |
|---|---|---|---|
| 8,362,560 B2 | 1/2013 | Kulkarni et al. | |
| 8,685,788 B2 | 4/2014 | Bao et al. | |
| 9,087,772 B2 | 7/2015 | Lauer et al. | |
| 9,184,238 B2 | 11/2015 | Hisada et al. | |
| 9,202,812 B2 | 12/2015 | Cheng et al. | |

(Continued)

OTHER PUBLICATIONS

Eguchi et al. "Comparison of arsenic and phosphorus diffusion behavior in silicon-germanium alloys," Applied Physics Letters, vol. 80, No. 10, pp. 1743-1745 (Mar. 2002).

(Continued)

*Primary Examiner* — Laura M Menz
*Assistant Examiner* — Candice Chan
(74) *Attorney, Agent, or Firm* — Vazken Alexanian; Michael J. Chang, LLC

(57) ABSTRACT

VFET devices and techniques for formation thereof having well-defined, sharp source/drain-to-channel junctions are provided. In one aspect, a method of forming a VFET device includes: forming a SiGe layer on a substrate, wherein the SiGe layer as formed on the substrate is undoped; forming an Si layer on the SiGe layer, wherein the Si layer as formed on the SiGe layer is undoped; patterning fins in the Si layer; forming sacrificial spacers along sidewalls of the fins; forming recesses in the SiGe layer between the fins; growing an epitaxial material in the recesses, wherein the epitaxial material grown in the recesses includes a source and drain dopant; annealing the epitaxial material to diffuse the source drain dopant into the SiGe layer under the fins forming bottom source and drains of the VFET device; and removing the sacrificial spacers. A VFET device formed by the method is also provided.

15 Claims, 11 Drawing Sheets

(56) References Cited

U.S. PATENT DOCUMENTS

| | | | |
|---|---|---|---|
| 9,202,920 B1 | 12/2015 | Liu et al. | |
| 9,530,700 B1* | 12/2016 | Mallela | H01L 27/0924 |
| 9,627,511 B1 | 4/2017 | Cheng et al. | |
| 9,728,635 B1* | 8/2017 | Cheng | H01L 29/7827 |
| 9,954,102 B1* | 4/2018 | Mochizuki | H01L 29/7827 |
| 2006/0128105 A1* | 6/2006 | Ouyang | H01L 21/823807 |
| | | | 438/300 |
| 2013/0032876 A1 | 2/2013 | Cheng et al. | |
| 2015/0255563 A1* | 9/2015 | Wu | H01L 29/66795 |
| | | | 257/401 |
| 2017/0323967 A1* | 11/2017 | Basker | H01L 29/7827 |

OTHER PUBLICATIONS

X-D. Wang et al., "Two-dimensional ultrashallow junction characterization of metal-oxide-semiconductor field effect transistors with strained silicon," Journal of Vacuum Science & Technology B, vol. 22, No. 1, Jan./Feb. 2004, pp. 373-376.

K.K. Bhuwalka et al., "A simulation approach to optimize the electrical parameters of a vertical tunnel FET," IEEE Transactions on Electron Devices, vol. 52, No. 7, Jul. 2005, pp. 1541-1547.

\* cited by examiner

VERTICAL FET WITH SHARP JUNCTIONS

FIELD OF THE INVENTION

The present invention relates to vertical field-effect transistor (VFET) devices, and more particularly, to VFET devices and techniques for formation thereof having well-defined, sharp source/drain-to-channel junctions.

BACKGROUND OF THE INVENTION

As opposed to planar complementary metal oxide semiconductor (CMOS) devices, vertical field effect transistors (VFETs) are oriented with a vertical fin channel disposed on a bottom source/drain and a top source/drain disposed on the fin channel. VFETs are being explored as a viable device option for continued CMOS scaling beyond the 7 nanometer (nm) technology node.

A typical VFET device includes a vertical fin that extends upward from the substrate. The fin forms the channel region of the transistor. A source region and a drain region are situated in electrical contact with the top and bottom ends of the channel region, while the gate is disposed on one or more of the fin sidewalls. One challenge for fabricating VFET is to achieve a sharp junction and low extension resistance at the interface between the source/drain and the channel. One approach to form the bottom source/drain in a VFET process flow is via ion implantation. However, implantation of dopant species tends to damage the vertical fin channel.

Another approach to forming a VFET bottom source/drain is by thermally-driven diffusion. While thermally-driven diffusion of dopant species can avoid damaging the fin channel, the diffusion process can be difficult to control to achieve the desired sharp, well-defined junction.

Therefore, techniques are needed for forming a VFET device with sharp, well-defined junctions.

SUMMARY OF THE INVENTION

The present invention provides vertical field-effect transistor (VFET) devices and techniques for formation thereof having well-defined, sharp source/drain-to-channel junctions. In one aspect of the invention, a method of forming a VFET device is provided. The method includes: forming a silicon germanium (SiGe) layer on a substrate, wherein the SiGe layer as formed on the substrate is undoped; forming a silicon (Si) layer on the SiGe layer, wherein the Si layer as formed on the SiGe layer is undoped; patterning fins in the Si layer; forming sacrificial spacers along sidewalls of the fins; forming recesses in the SiGe layer between the fins; growing an epitaxial material in the recesses, wherein the epitaxial material grown in the recesses includes a source and drain dopant; annealing the epitaxial material to diffuse the source drain dopant into the SiGe layer under the fins forming bottom source and drains of the VFET device; and removing the sacrificial spacers.

In another aspect of the invention, a VFET device is provided. The VFET device includes: a substrate; a SiGe layer disposed on the substrate; fins disposed on the SiGe layer, wherein the fins include undoped Si; recesses in the SiGe layer between the fins; and an epitaxial material in the recesses that includes a source and drain dopant, wherein the SiGe layer under the fins also includes the source and drain dopant and forms bottom source and drains of the VFET device.

A more complete understanding of the present invention, as well as further features and advantages of the present invention, will be obtained by reference to the following detailed description and drawings.

DETAILED DESCRIPTION OF PREFERRED EMBODIMENTS

Figure 1:
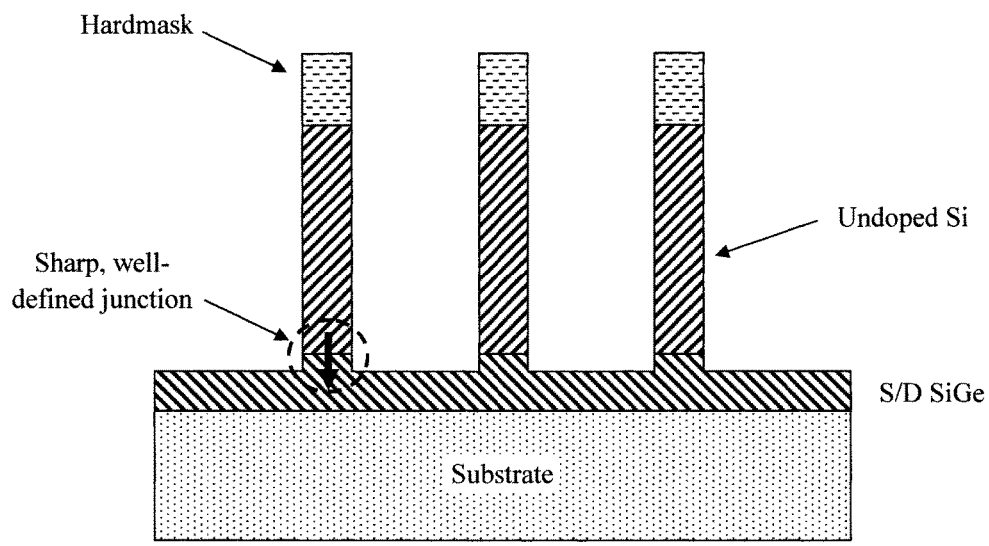
FIG. 1 is a cross-sectional diagram illustrating the source/drain-to-channel junction in a vertical field-effect transistor (VFET) device architecture according to an embodiment of the present invention.

Provided herein are techniques for forming vertical field-effect transistor (FET) devices having well-defined source/drain-to-channel junctions. Of particular focus is the process for forming the bottom source/drain below the vertical channel. Referring to FIG. 1, for example, the present VFET design has a silicon germanium (SiGe) bottom source drain (S/D) and an (undoped) silicon (Si) vertical fin channel disposed on the bottom source/drain. A goal of the present techniques is to make the junction between the Si channel and the SiGe bottom source/drain as sharp and well-defined as possible.

Figure 2:
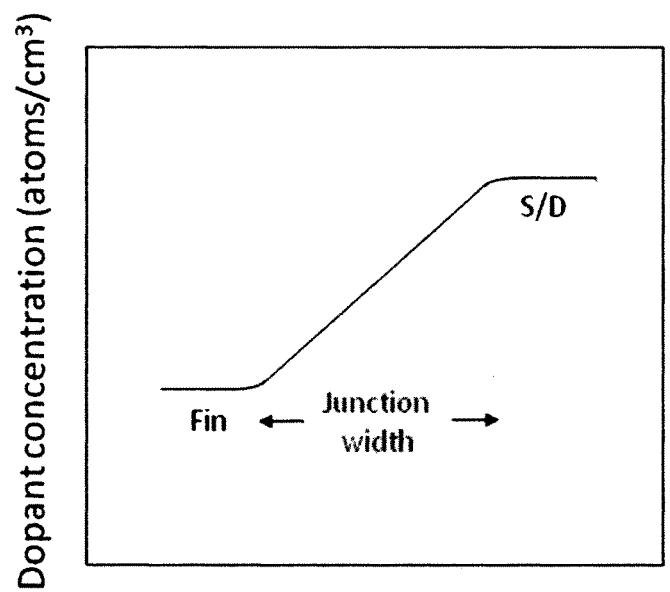
FIG. 2 is a diagram illustrating dopant concentration from the undoped fin channel to the doped bottom source/drain according to an embodiment of the present invention.

One parameter for assessing the characteristics of the sharpness of the junction is junction width. See, for example, FIG. 2. FIG. 2 is a diagram illustrating dopant concentration as one moves from the undoped fin channel to the doped bottom source/drain. The region of the plot between the minimum/undoped fin channel and maximum/doped bottom source/drain is the junction width. Ideally, the junction width is made as small as possible which can be achieved by having a sharp interface between the doped source/drain and the undoped channel. With conventional techniques however, diffusion of dopant species into the source/drain is difficult to control resulting in a larger junction width due to insufficient diffusion of the dopant species throughout the source/drain or the diffusion of the dopant species into the vertical channel.

As will be described in detail below, the present techniques involve forming the bottom source/drain at the beginning of the process (prior to forming the gate or top source/drain). Namely, following patterning of the fins that will serve as the vertical channels of the device, sacrificial spacers are then used to cover/protect the vertical fin channel while heavily doped epitaxial silicon (Si) is grown in recesses in the bottom source/drain between the fins. This doped epitaxial Si is used to dope the bottom source/drain through drive in diffusion. Due to a faster diffusion rate of dopants through the source/drain (as compared to the Si fin channel), sharp, well-defined junctions are produced.

Figure 3:
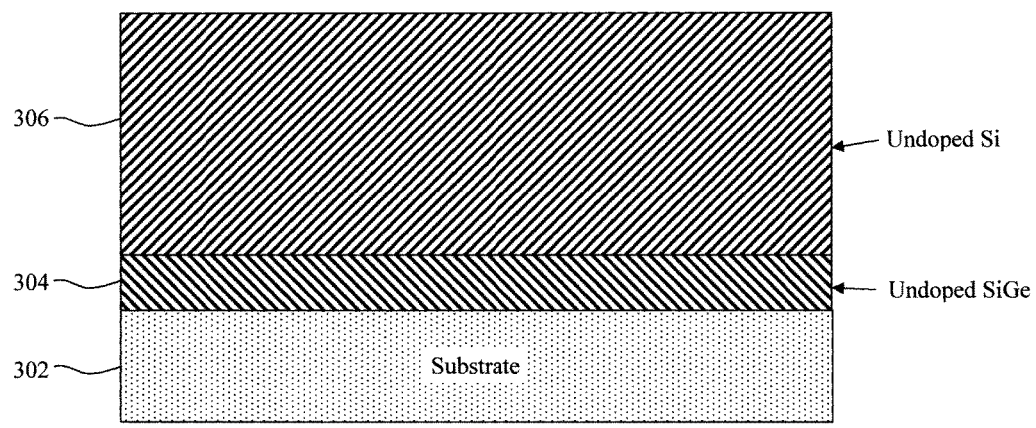
FIG. 3 is a diagram illustrating a starting structure for forming a VFET device that includes a substrate, an undoped SiGe layer having been formed on the substrate, and an undoped Si layer having been formed on the undoped SiGe layer according to an embodiment of the present invention.

An exemplary embodiment of the present techniques is now described for achieving the above-described sharp and well-defined source/drain-to-channel junctions is now described by way of reference to FIGS. 3-21. As shown in FIG. 3, the process begins with a substrate 302, an undoped SiGe layer 304 being formed on the substrate 302, and an undoped Si layer 306 being formed on the undoped SiGe layer 304.

A variety of different substrate 302 configurations can be implemented in accordance with the present techniques. For instance, according to one exemplary embodiment, the starting substrate 302 is a bulk semiconductor wafer, such as a bulk Si, bulk Ge and/or bulk SiGe wafer. Alternatively, the substrate 302 can be a semiconductor-on-insulator (SOI) wafer. In general, a SOI wafer includes a SOI layer separated from an underlying substrate by a buried insulator. When the buried insulator is an oxide it is often referred to as a buried oxide or BOX. The SOI layer can include any suitable semiconductor, such as Si, Ge and/or SiGe.

According to an exemplary embodiment, an epitaxial process is used to grow both the undoped SiGe layer 304 on the substrate 302 and the undoped Si layer 306 on the undoped SiGe layer 304. Accordingly, growth of the (epitaxial) SiGe and Si layers will be templated off of the underlying substrate 302. By way of example only, the undoped SiGe layer 304 is formed on the substrate 302 to a thickness of from about 3 nanometers (nm) to about 30 nm, and ranges therebetween, and the undoped Si layer 306 is formed on the undoped SiGe layer 304 to a thickness of from about 10 nm to about 50 nm, and ranges therebetween.

As will become apparent from the description that follows, the undoped Si layer 306 will be used to form the vertical fin channels, and the undoped SiGe layer 304 will be used to form the bottom source/drain. It is only after the bottom source/drain is formed that the gate and top source/drain will be formed.

Undoped Si layer 306 is then patterned to form at least one vertical fin channel of the VFET device. Standard lithography and etching techniques can be implemented to directly pattern the fins from a patterned fin hardmask. Other patterning techniques are also contemplated herein. For instance, a sidewall image transfer (SIT) technique is shown illustrated in the figures. An advantage to an SIT process is that SIT permits the patterning of feature sizes below that which can be achieved using direct patterning.

Figure 4:
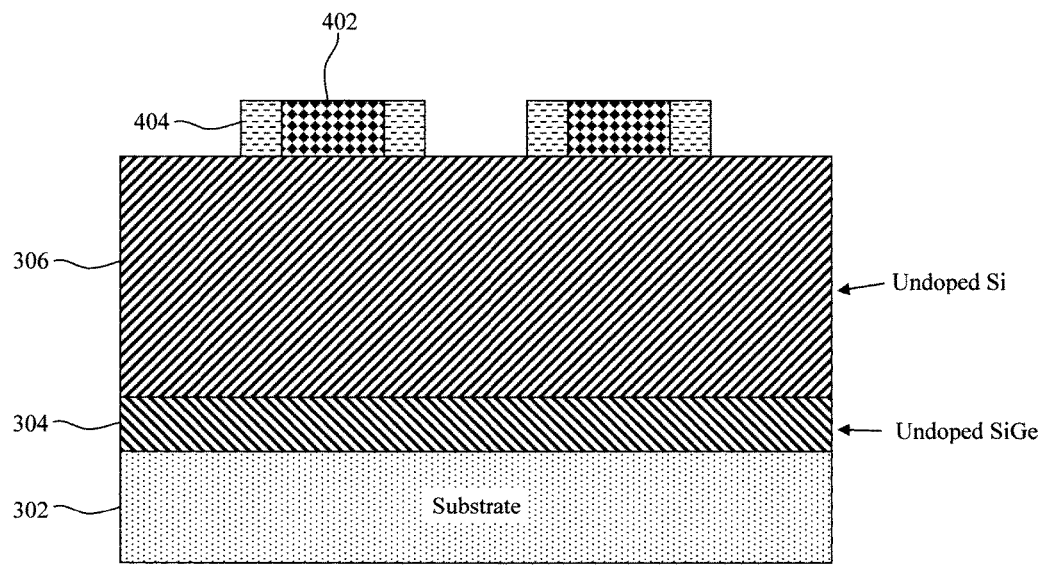
FIG. 4 is a diagram illustrating a sidewall image transfer (SIT) process whereby at least one mandrel is formed on the undoped Si layer, and sidewall spacers are formed on opposite sides of the mandrels according to an embodiment of the present invention.

For instance, as shown in FIG. 4 SIT involves using standard lithography and etching techniques to first pattern at least one mandrel 402 on the undoped Si layer. The mandrels 402 are a sacrificial structure used merely to place sidewall spacers for fin patterning. Thus, the mandrels 402 are formed from a material that can be selectively removed relative to the spacers such as amorphous silicon, polysilicon, amorphous carbon, silicon germanium (SiGe), an organic planarization layer (OPL), silicon dioxide ($SiO_2$) and/or silicon nitride (SiN).

Following patterning of the mandrels 402, sidewall spacers 404 are formed on opposite sides of the mandrels. See FIG. 4. By way of example only, a suitable spacer material is blanket deposited onto and covering the mandrels and then patterned into individual spacers 404. Suitable materials for spacers 404 include, but are not limited to, $SiO_2$, SiN, silicon oxynitride (SiON), silicon carbide (SiC) and/or amorphous carbon. However, as provided above, the mandrels 402 will be removed selective to the spacers 404. Thus, the choice of mandrel and spacer material should be made to permit this selectivity. For instance, when the mandrels 402 are formed from an oxide such as $SiO_2$, the spacers 404 can be formed from a nitride (SiN), or vice versa. As such, an oxide- or nitride-selective etch can be used to remove one (oxide or nitride) relative to the other. According to a non-limiting exemplary embodiment, the mandrels 402 are formed from an oxide material and the spacers 404 are formed from a nitride material. Thus, after removal of the mandrels 402 a nitride fin hardmask formed by the spacers 404 remains for fin patterning.

Figure 5:
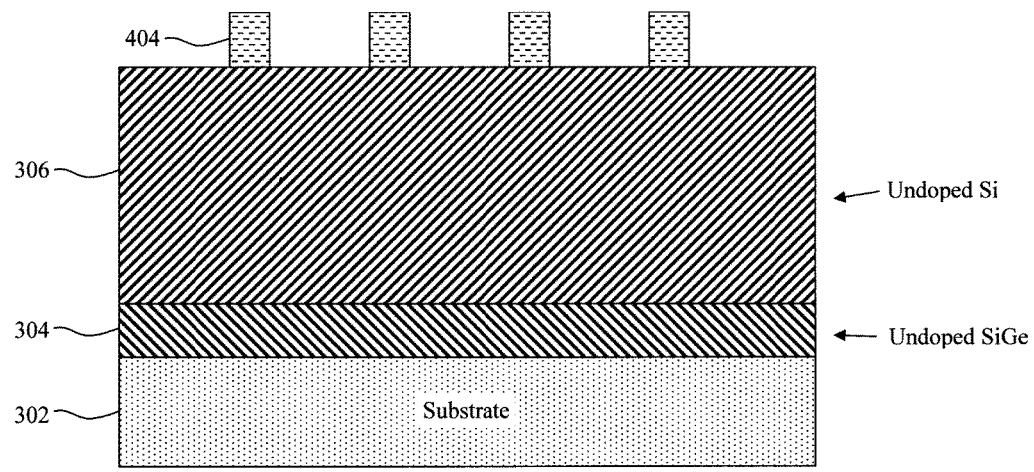
FIG. 5 is a diagram illustrating the mandrels having been removed selective to the sidewall spacers according to an embodiment of the present invention.

Namely, as shown in FIG. 5 the mandrels 402 have been selectively removed. What remains are individual fin hardmasks formed by the spacer 404 on the undoped Si layer 306. It is notable that the SIT process described herein is a pitch doubling technique. Namely, there are now two spacers 404/fin hardmask for each mandrel 402 originally patterned on the undoped Si layer 306.

Figure 6:
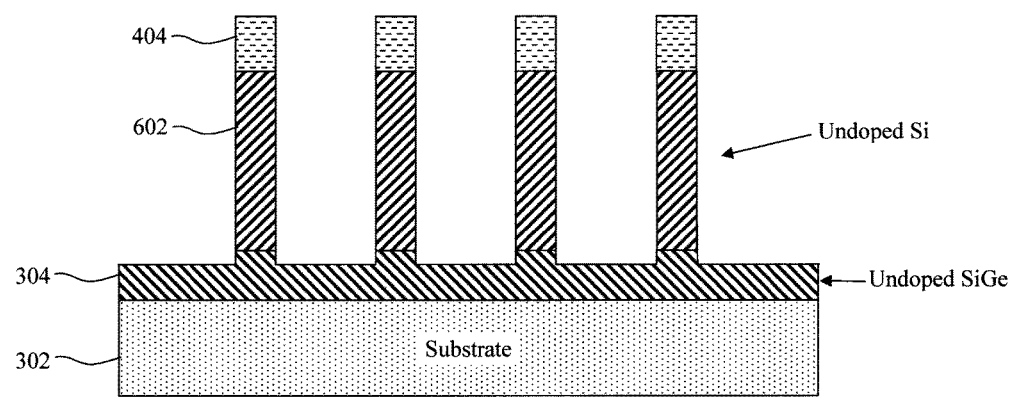
FIG. 6 is a diagram illustrating the sidewall spacers being used as fin hardmask to pattern the undoped Si layer into one or more individual fins according to an embodiment of the present invention.
Figure 7:
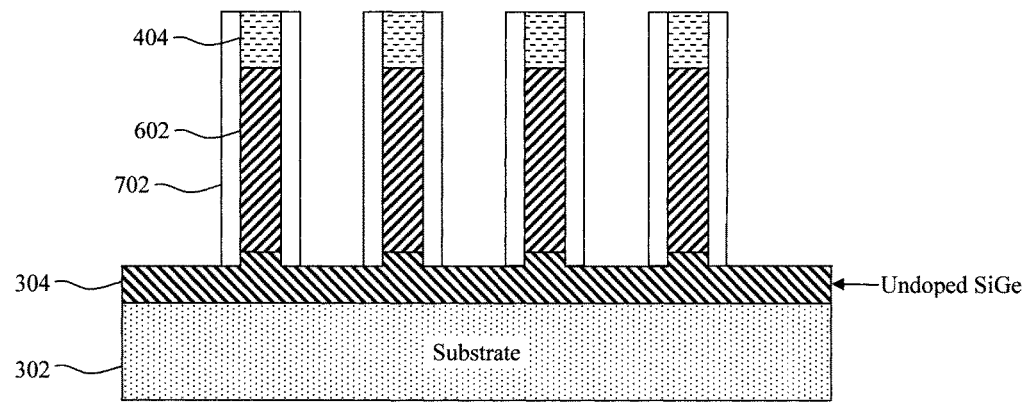
FIG. 7 is a diagram illustrating sacrificial spacers having been formed on opposite sides of each of the fins along sidewalls of the fins according to an embodiment of the present invention.

As shown in FIG. 6, the spacers 404/fin hardmask are then used to pattern the undoped Si layer 306 into one or more individual fins 602. As shown in FIG. 6, the etch used to pattern the fins 602 is non-selective in the sense that it continues down through the undoped Si layer 306 and into a portion of the undoped SiGe layer 304. Thus, the fins 602 include a portion of the undoped SiGe layer 304 (i.e., the fins 602 extend completely through the undoped Si layer 306 and part way through the undoped SiGe layer 304).

The next task is to grow heavily doped epitaxial Si in between the fins 602 for source drain doping. However in order to protect the fins 602 during this process, sacrificial spacers 702 are first formed on opposite sides of each of the fins 602 along the sidewalls of the fins 602. See FIG. 7. Suitable materials for the sacrificial spacers 702 include but are not limited to nitride spacer materials such as SiN and/or silicon nitride carbide. As provided above, the spacers 702 can be formed by blanket depositing the spacer material onto the fins 602 and then patterning the spacer material into the individual sacrificial spacers 702. By 'sacrificial' it is meant that the spacers 702 will be removed later on in the process after the bottom source/drain has been formed.

Figure 8:
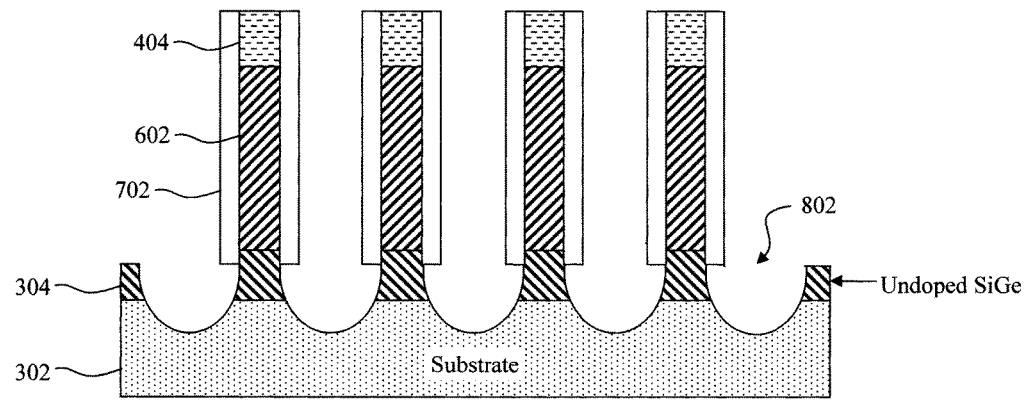
FIG. 8 is a diagram illustrating recesses having been formed in the SiGe layer (and a portion of the substrate) in between the fins according to an embodiment of the present invention.

As shown in FIG. 8, the bottom source/drain is next recessed between the fins. In the present VFET architecture, the fins 602 will form the channel regions of the VFET and the SiGe layer 304 beneath the fins (which will become doped later in the process) will used to form the bottom source/drain. According to an exemplary embodiment, an isotropic etching process such as a wet etch is used to form recesses 802 between the fins 602. During this recess etch, the fins 602 are protected by the sacrificial spacers 702 along their sidewalls and the spacers 404/fin hardmask at their tops. Thus, the recess etch is limited to the source/drain in between the fins 602.

As shown in FIG. 8, the recesses 802 extend through the undoped SiGe layer 304 and partway into the substrate 302. A heavily doped source/drain epitaxial material will be grown in the recesses 802 for source/drain doping. This epitaxial growth will be templated off of the (now-exposed) substrate 302 within the recesses 802.

Figure 9:
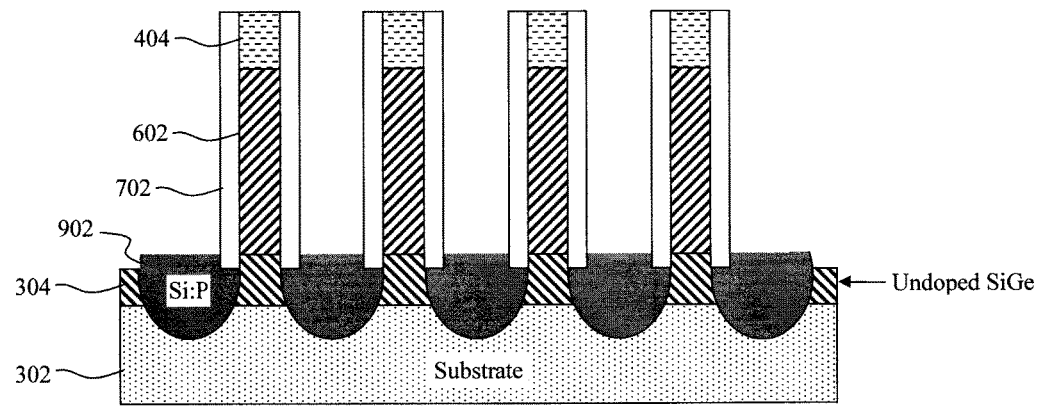
FIG. 9 is a diagram illustrating a heavily-doped source/drain epitaxial material having been grown in the recesses according to an embodiment of the present invention.
Figure 10:
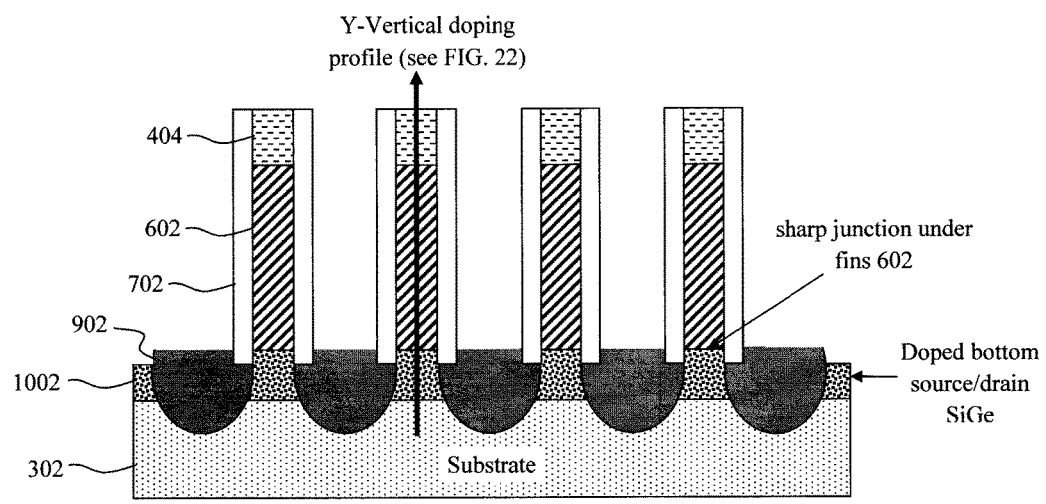
FIG. 10 is a diagram illustrating an anneal having been used to diffuse a source/drain dopant from the source/drain epitaxial material into the SiGe layer under the fins according to an embodiment of the present invention.

Namely, as shown in FIG. 9 a source/drain epitaxial material 902 is grown in the recesses 802. For source/drain doping, the epitaxial material 902 is heavily doped with an n-type or a p-type source/drain dopant, e.g., at a concentration of from about $4 \times 10^{20}$ atoms/cm$^3$ to about $2 \times 10^{21}$ atoms/cm$^3$, and ranges therebetween. By way of example only, the epitaxial material 902 can be doped in-situ while being grown in the recesses 802. Alternatively, dopant implantation techniques can be employed following growth of the epitaxial material 902 in the recesses 802. According to an exemplary embodiment, the epitaxial material 902 in the recesses 802 is phosphorous (P)-doped epitaxial Si (Si:P). This will result in the formation of an n-channel VFET device by the present process. In another exemplary embodiment, an epitaxial silicon doped with both carbon and phosphorous (Si:C(P)) is grown in the recesses 802. The Si:C(P) preferably has an atomic carbon concentration of from about 0.2% to about 3% and ranges therebetween, such as an atomic carbon concentration of from about 0.5% to about 1.5% and ranges therebetween. It is to be understood that the total amount of carbon in a crystalline semiconductor layer may be higher than the substitutional amount. This too will result in the formation of an n-channel VFET device by the present process. However, embodiments are described below where a dopant of the opposite polarity is employed to form a p-channel VFET.

A thermally-driven diffusion of the source/drain dopant (e.g., phosphorous) from the source/drain epitaxial material 902 is then used to form source/drain extensions 1002 by diffusing the source/drain dopant into the SiGe layer 304 under the fins 602. See FIG. 10. According to an exemplary embodiment, the thermal diffusion is performed by annealing the source/drain epitaxial material 902 at a temperature of from about 900° C. to about 1200° C. and ranges therebetween, for a duration of from about 1 minute to about 10 minutes and ranges therebetween.

Advantageously, the faster diffusion rate of the source/drain dopant (e.g., phosphorous) in the source/drain SiGe layer 304 as compared to in the Si of the fins 602 is leveraged to establish a sharp junction under the fins 602. See FIG. 10. Specifically, since the diffusion rate of the source/drain dopant (phosphorous in this example) is faster in the source/drain SiGe than in the fin Si, for an anneal of a given duration the dopant will diffuse rapidly throughout the source/drain with little to no diffusion into the fin. The result is a sharp interface between the (doped) source/drain and the (undoped) fin channel.

Figure 11:
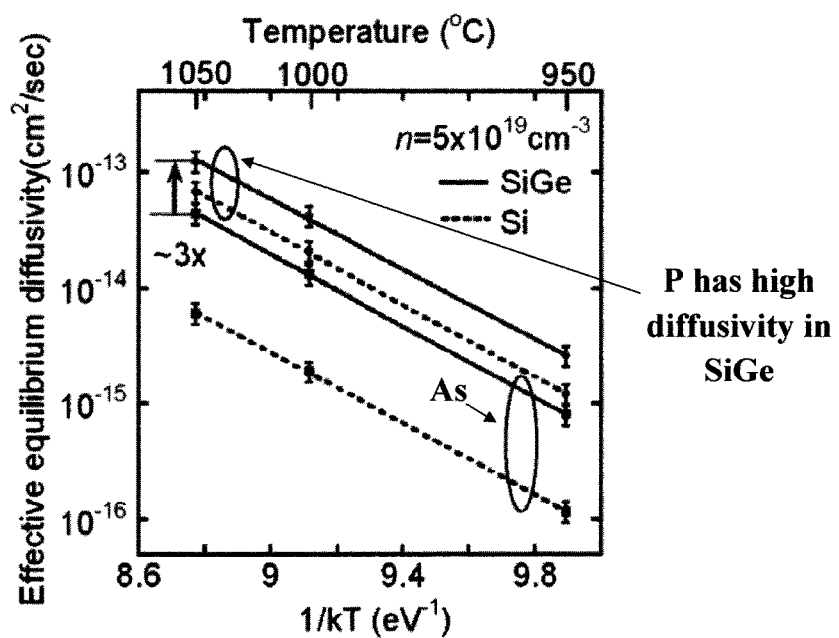
FIG. 11 is a diagram illustrating the effective diffusivities of phosphorous (P) in both Si and SiGe as compared to other dopants such as arsenic (As) according to an embodiment of the present invention.
Figure 12:
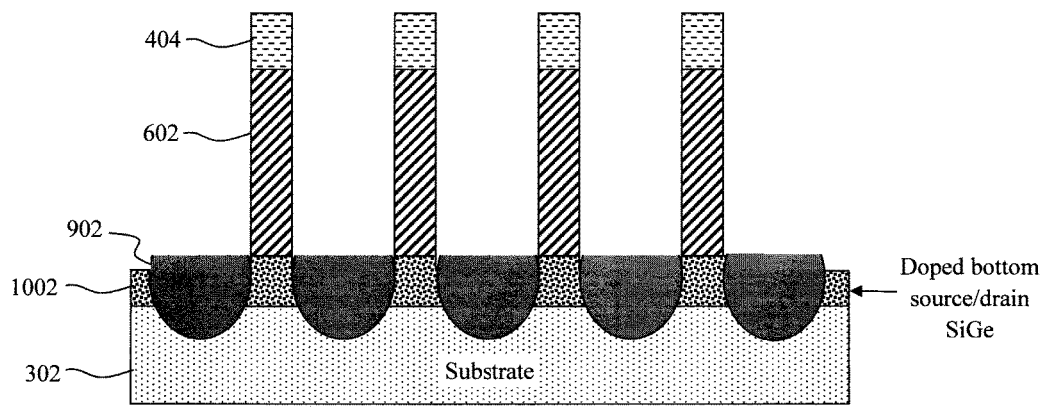
FIG. 12 is a diagram illustrating the sacrificial spacers having been removed according to an embodiment of the present invention.
Figure 13:
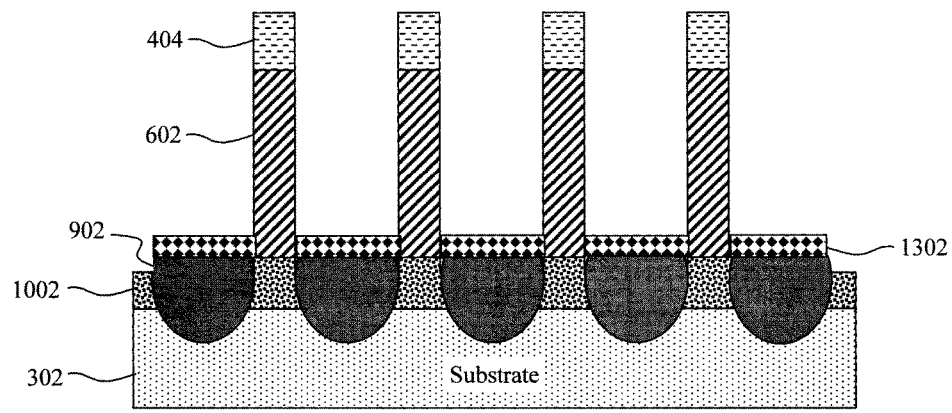
FIG. 13 is a diagram illustrating a bottom spacer having been formed on the bottom source/drain according to an embodiment of the present invention.
Figure 14:
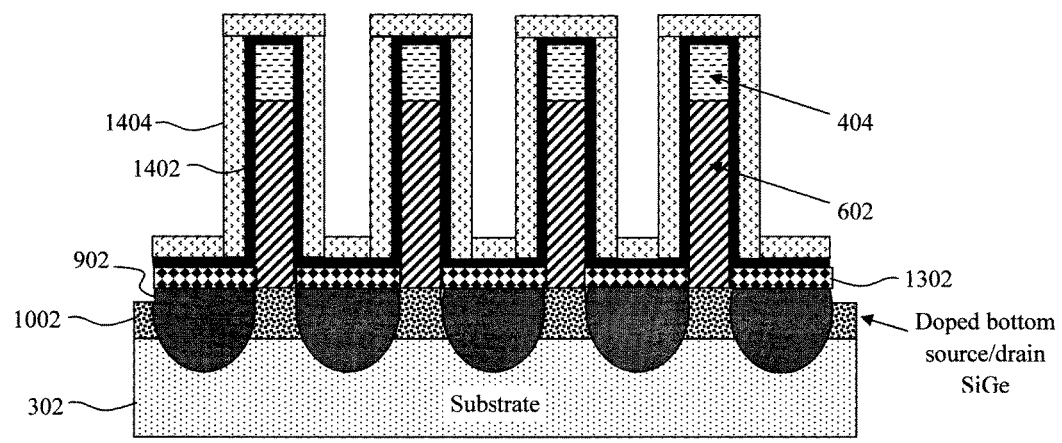
FIG. 14 is a diagram illustrating a gate dielectric having been deposited onto the fins and the bottom spacers, followed by a gate conductor according to an embodiment of the present invention.

By way of example only, the effective diffusivities of arsenic (As) and phosphorous (P) in both Si and SiGe under equilibrium conditions is shown illustrated in FIG. 11 (see Eguchi et al. "Comparison of arsenic and phosphorus diffusion behavior in silicon-germanium alloys," Applied Physics Letters, vol. 80, no. 10, pgs. 1743-1745 (March 2002), the contents of which are incorporated by reference as if fully set forth herein). In FIG. 11, circles are used to identify the plots corresponding to the diffusivity of arsenic (As) in both Si and SiGe and those corresponding to the diffusivity of phosphorous (P) in both Si and SiGe. Both dopants (As and P) show a higher diffusivity in SiGe (as compared to Si) which increases linearly with an increase in annealing temperature. However, phosphorous exhibits an overall higher diffusivity in SiGe thus making it an ideal dopant for the present techniques.

Now that the bottom source/drains have been formed, the process to complete the VFET device involves forming gates alongside the fins 602 and source/drains on top of the fins 602. To enable these further processing steps, the sacrificial spacers 702 are now removed. See FIG. 12. As provided above, the sacrificial spacers 702 can be formed from a suitable nitride spacer material, and as such a nitride-selective etch can be employed for their removal. Removal of the sacrificial spacers 702 exposes the sidewalls of the fins 602.

A bottom spacer 1302 is then formed on the bottom source/drain. Bottom spacer 1302 will offset the gate (formed as described below) from the bottom source/drain. A counterpart top spacer will too be formed that separates the gate from the top source/drain. See below. Suitable materials for the bottom spacer 1302 include, but are not limited to, oxide spacer materials such as SiO$_2$ and/or nitride spacer materials such as SiN.

According to an exemplary embodiment, the bottom spacers 1302 are formed using a directional deposition process whereby the spacer material is deposited onto the bottom source/drain and fins 602 with a greater amount of the material being deposited on the horizontal surfaces, as compared to the vertical surfaces. To use an illustrative example, a greater thickness of the spacer material will be deposited on top of the source/drain in between the fins 602 than along the sidewalls of the fins 602. Thus, when an etch is used on the spacer material, the timing of the etch needed to remove the spacer material from the vertical surfaces will leave the bottom spacers 1302 shown in FIG. 13 on top of the source drain since a greater amount of the spacer material was present on the bottom source/drain to begin with. By way of example only, a high density plasma (HDP) chemical vapor deposition (CVD) or physical vapor deposition (PVD) process can be used for directional film deposition, and an oxide- or nitride-selective (depending on the spacer material) isotropic etch can be used to remove the (thinner) spacer material deposited onto the vertical surfaces.

To form the gates of the VFET device, a gate dielectric 1402 is first deposited onto the fins 602 and bottom spacers 1302, followed by a gate conductor 1404. See FIG. 14. In the exemplary embodiment illustrated in the figures, both the gate dielectric 1402 and the gate conductor 1404 are conformal layers. However, that is merely one example. For instance, the gate conductor can instead fully fill the space in between the fins. See, for example, U.S. Pat. No. 9,627,511 B1 issued to Cheng et al., entitled "Vertical Transistor Having Uniform Bottom Spacers," the contents of which are incorporated by reference as if fully set forth herein.

According to an exemplary embodiment, a metal gate is formed wherein the gate conductor 1404 is a metal or combination of metals and the gate dielectric 1402 is a high-κ dielectric. For instance, the gate conductor 1404 is a workfunction setting metal. The particular workfunction metal employed can vary depending on whether an n-type or p-type transistor is desired. Suitable n-type workfunction setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction setting metals include, but are not limited to, TiN, TaN, and tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

The term "high-κ" as used herein refers to a material having a relative dielectric constant κ which is much higher than that of silicon dioxide (e.g., a dielectric constant κ=25 for $HfO_2$ rather than 4 for silicon dioxide). Suitable high-κ gate dielectrics include, but are not limited to, hafnium oxide ($HfO_2$) and/or lanthanum oxide ($La_2O_3$).

Figure 15:
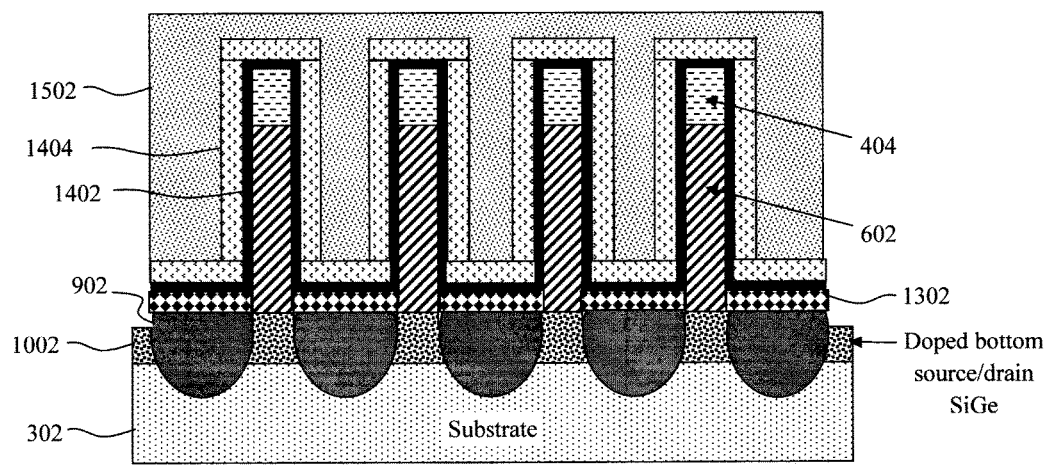
FIG. 15 is a diagram illustrating an organic planarizing layer (OPL) having been deposited onto the gate conductor over the fins according to an embodiment of the present invention.

As shown in FIG. 15, a dielectric such as an organic planarizing layer (OPL) 1502 is next deposited onto the gate conductor 1404 over the fins 602. In the particular example shown illustrated in the figures, the spaces in between the fins 602 left by the conformal gate dielectric 1402/gate conductor 1404 are now filled in by the OPL 1502.

Figure 16:
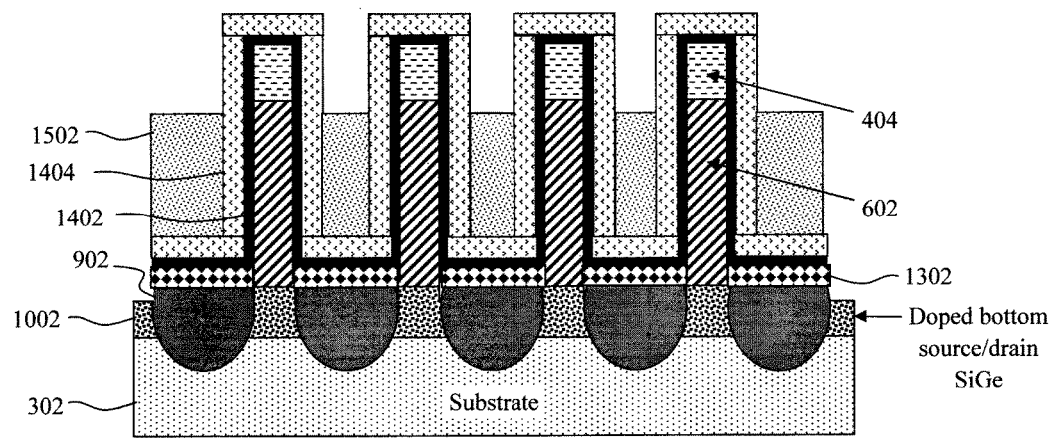
FIG. 16 is a diagram illustrating the OPL having been recessed below the fin hardmasks and below the tops of the fins according to an embodiment of the present invention.
Figure 17:
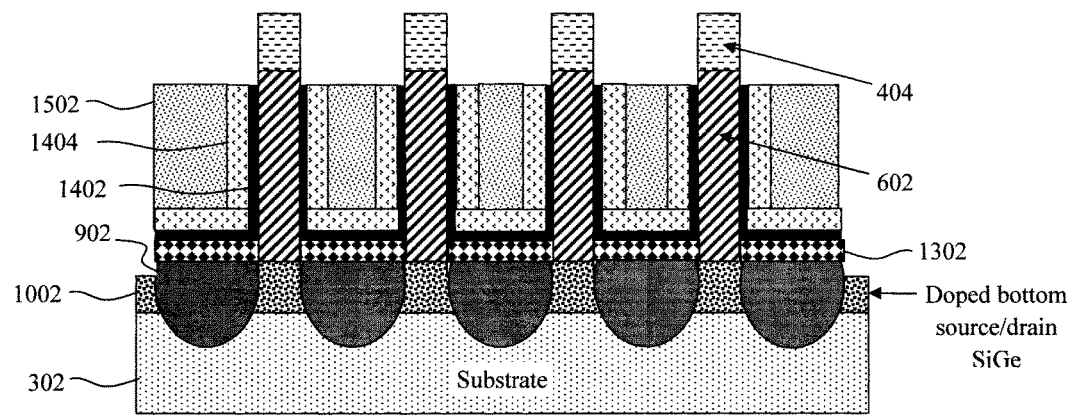
FIG. 17 is a diagram illustrating the gate dielectric and gate conductor having been recessed according to an embodiment of the present invention.

As deposited, the OPL 1502 surrounds and fully covers the fins 602. See FIG. 15. However, access to the tops of the fins 602 is needed in order to form the top source/drains. As such, as shown in FIG. 16 the OPL 1502 is then recessed to expose the tops of the fins 602. Since the objective is to expose the tops of the fins 602, it is notable that the OPL 1502 needs to be recessed below the spacers 404/fin hardmask (which will subsequently be removed) and below the tops of the fins 602 (i.e., a top of the recessed OPL is now below the tops of the fins). See FIG. 16. Following recess of the OPL 1502, the gate dielectric 1402 and gate conductor 1404 are also recessed. See FIG. 17. As shown in FIG. 17, recessing the gate dielectric 1402 and gate conductor 1404 fully exposes the spacers 404/fin hardmask at the tops of the fins 602.

Figure 18:
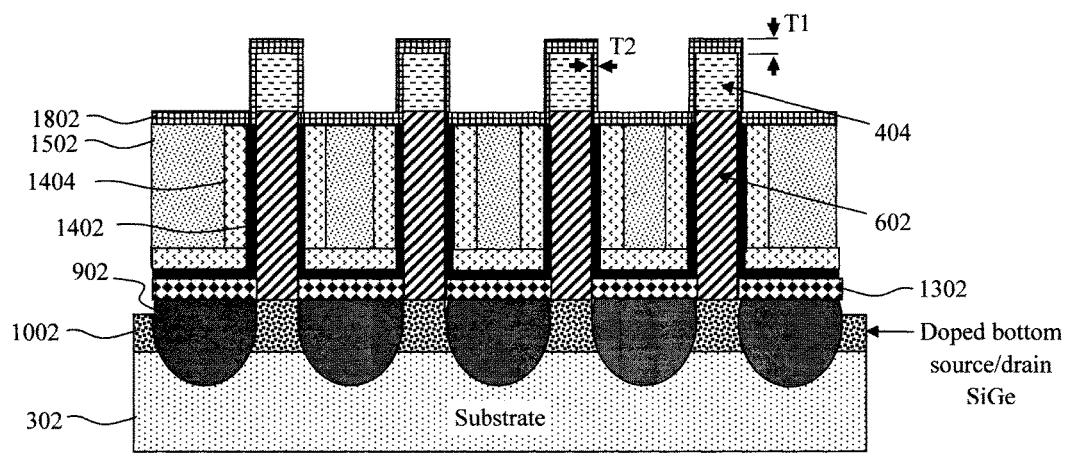
FIG. 18 is a diagram illustrating a spacer material having been deposited onto the fin hardmasks and recessed OPL according to an embodiment of the present invention.
Figure 19:
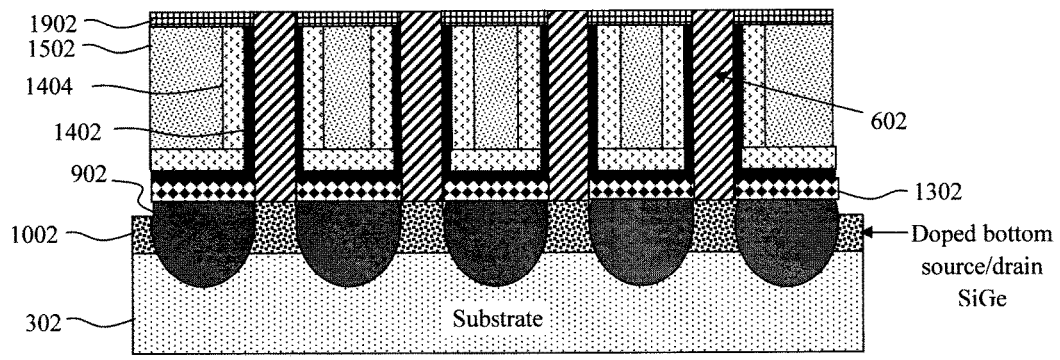
FIG. 19 is a diagram illustrating the fin hardmasks and excess spacer material having been removed forming top spacers in between the tops of the fins according to an embodiment of the present invention.
Figure 20:
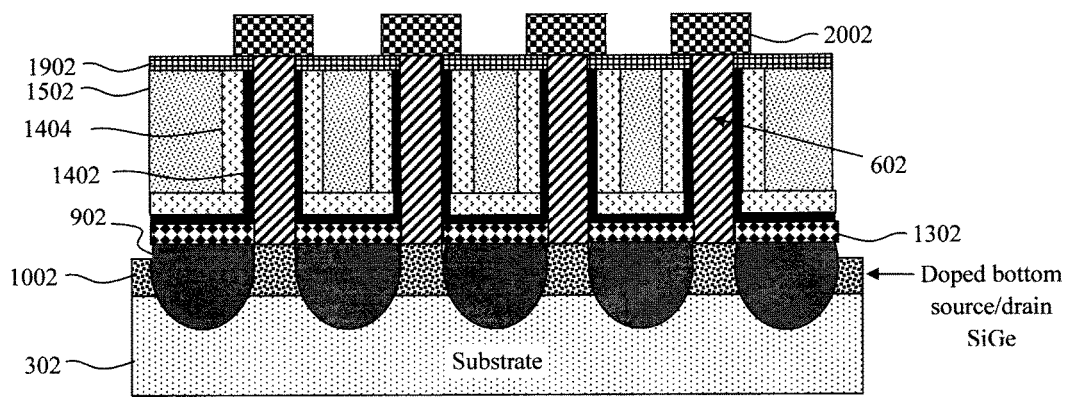
FIG. 20 is a diagram illustrating top source/drains having been formed on the tops of the fins according to an embodiment of the present invention.

As highlighted above, a counterpart top spacer is needed to offset the gate from the top source/drain. To form the top spacer, a spacer material 1802 is next deposited onto the spacers 404/fin hardmask and (recessed) OPL 1502. See FIG. 18. As above, suitable spacer materials include, but are not limited to, oxide spacer materials such as $SiO_2$ and/or nitride spacer materials such as SiN. In the same manner as described above, a directional deposition process (such as HDP CVD or PVD) can be employed which, as shown in FIG. 18, results in the deposited spacer material 1802 being thicker on the horizontal surfaces (e.g., T1) as compared to on the vertical surfaces (e.g., T2, wherein T1>T2).

A planarizing etch such as chemical-mechanical polishing (CMP) is then used to remove the spacers 404/fin hardmask and with it excess spacer material 1802. The result is top spacers 1902 being formed in between the (now exposed) tops of the fins 602. See FIG. 19. Selective epitaxial growth can then be used to form top source/drains 2002 on the tops of the fins 602. See FIG. 20. As with the bottom source/drains, the top source/drains 2002 can be doped with an n-type dopant. For instance, by way of example only, the top source/drains 2002 can be formed from in-situ phosphorous-doped SiGe (SiGe:P). Any further processing, if needed, can be performed to complete the device such as forming contacts to the top source/drain and/or any subsequent metallization, etc.

Figure 21:
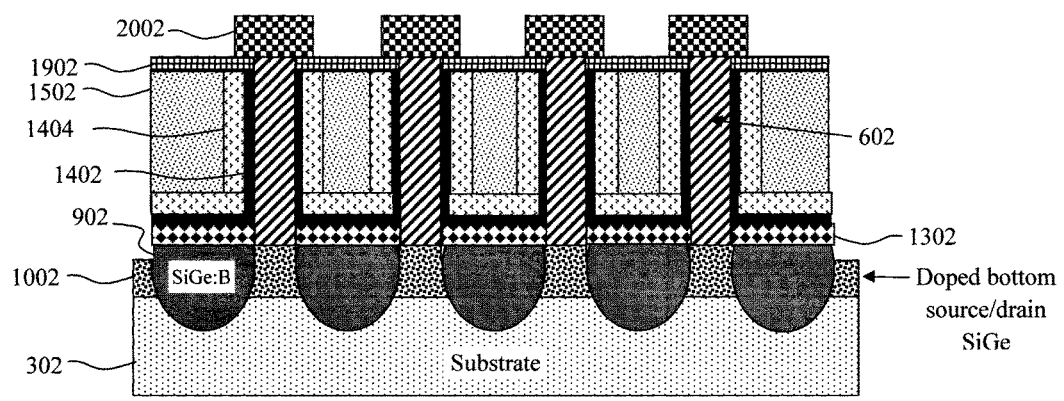
FIG. 21 is a diagram illustrating implementation of dopants of an opposite polarity to instead form a p-channel VFET device according to an embodiment of the present invention.

In the above example, an n-type dopant (e.g., phosphorous) is used in the top/bottom source/drain to form an n-channel VFET device. As provided above, however, a dopant of the opposite polarity can instead be employed to form a p-channel VFET. The process for forming the p-channel VFET would be the same as that described above, except with a variation in the dopant employed for the source/drain, i.e., a p-type rather than n-type dopant. Suitable p-type dopants include, but are not limited to boron (B). Thus, for instance, as shown in FIG. 21 the epitaxial material 902 grown in the recesses 802 can instead be boron (B)-doped SiGe (SiGe:B). Likewise, the top source/drains 2002 can be formed from in-situ boron (B)-doped SiGe (SiGe:B). This will result in the formation of a p-channel VFET device by the present process.

Figure 22:
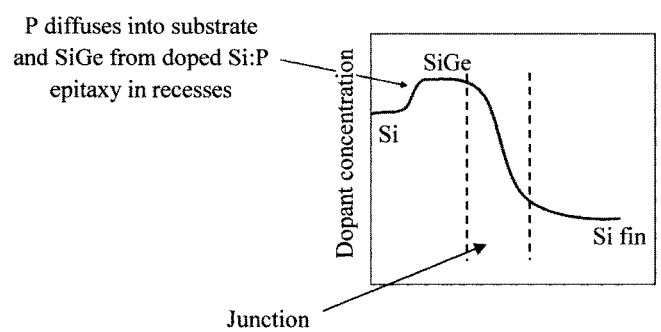
FIG. 22 is a diagram illustrating the Y-vertical doping profile of the present device structure according to an embodiment of the present invention.

As provided above, the present techniques result in well-defined, sharp junctions between the bottom source/drain and the vertical fin channel. See, for example, FIG. 22, which illustrates the Y-vertical doping profile of the device structure shown in FIG. 10. As shown in FIG. 22, the phosphorous (P) diffuses in the fin bottom (substrate and SiGe) from the doped Si:P epitaxy in the recesses. There is a higher doping concentration in the SiGe due to the faster P diffusion in the SiGe than in the Si. According to an exemplary embodiment, the junction has a doping gradient of less than 5 nanometers (nm) per decade, meaning that the doping concentration drops 1 order of magnitude within a 5 nm range.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a vertical field-effect transistor (VFET) device, the method comprising the steps of:
   forming a silicon germanium (SiGe) layer on a substrate, wherein the SiGe layer as formed on the substrate is undoped;
   forming a silicon (Si) layer on the SiGe layer, wherein the Si layer as formed on the SiGe layer is undoped;
   patterning fins in the Si layer by forming fin hardmasks on the Si layer, and etching the fins in the Si layer using the fin hardmasks;
   forming sacrificial spacers along sidewalls of the fins;
   forming recesses in the SiGe layer between the fins;
   growing an epitaxial material in the recesses, wherein the epitaxial material grown in the recesses comprises a source and drain dopant;
   annealing the epitaxial material to diffuse the source drain dopant into the SiGe layer under the fins forming bottom source and drains of the VFET device;
   removing the sacrificial spacers;
   forming a bottom spacer on the bottom source and drains of the VFET device;
   depositing a gate dielectric onto the fins and the bottom spacer;
   depositing a gate conductor onto the gate dielectric;
   depositing an organic planarizing layer (OPL) over the fins;
   recessing the OPL below tops of the fins;
   recessing the gate dielectric and the gate conductor to expose the fin hardmasks on the tops of the fins;
   forming a top spacer on the OPL in between the tops of the fins;
   removing the fin hardmasks; and
   forming top source and drains of the VFET device on the tops of the fins.

2. The method of claim 1, wherein the substrate comprises a semiconductor selected from the group consisting of: Si, Ge, SiGe, and combinations thereof.

3. The method of claim 1, wherein the fins extend partway through the SiGe layer.

4. The method of claim 1, wherein the sacrificial spacers comprise a nitride spacer material selected from the group consisting of: silicon nitride (SiN), silicon nitride carbide, and combinations thereof.

5. The method of claim 1, wherein the recesses extend partway through the substrate.

6. The method of claim 1, wherein the source and drain dopant comprises phosphorous (P), and wherein the epitaxial material grown in the recesses is selected from the group consisting of: Si:P and Si:C(P).

7. The method of claim 1, wherein the source and drain dopant comprises boron (B), and wherein the epitaxial material grown in the recesses comprises SiGe:B.

8. The method of claim 1, wherein the epitaxial material grown in the recesses comprises the source and drain dopant at a concentration of from about $4 \times 10^{20}$ atoms/cm$^3$ to about $2 \times 10^{21}$ atoms/cm$^3$ and ranges therebetween.

9. The method of claim 1, wherein the annealing is performed at a temperature of from about 900° C. to about 1200° C. and ranges therebetween, for a duration of from about 1 minute to about 10 minutes and ranges therebetween.

10. The method of claim 1, wherein the fin hardmasks are formed on the Si layer using a sidewall image transfer (SIT) process.

11. The method of claim 1, wherein the gate dielectric comprises a high-κ dielectric selected from the group consisting of: hafnium oxide (HfO$_2$), lanthanum oxide (La$_2$O$_3$), and combinations thereof.

12. The method of claim 1, wherein the gate conductor comprises a workfunction setting metal selected from the group consisting of: titanium nitride (TiN), tantalum nitride (TaN), an aluminum (Al)-containing alloy, titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), and combinations thereof.

13. The method of claim 1, wherein the bottom spacer and the top spacer each comprises a material selected from the group consisting of: silicon oxide (SiO$_2$), SiN, and combinations thereof.

14. The method of claim 1, wherein the top source and drains comprise SiGe:P.

15. The method of claim 1, wherein the top source and drains comprise SiGe:B.

* * * * *